(12) United States Patent
Yokoyama et al.

(10) Patent No.: US 8,597,567 B2
(45) Date of Patent: Dec. 3, 2013

(54) CERAMIC SHEET AND METHOD FOR PRODUCING THE SAME

(75) Inventors: Shohei Yokoyama, Nagoya (JP); Nobuyuki Kobayashi, Nagoya (JP); Tsutomu Nanataki, Toyoake (JP)

(73) Assignee: NGK Insulators, Ltd., Nagoya (JP)

( * ) Notice: Subject to any disclaimer, the term of this patent is extended or adjusted under 35 U.S.C. 154(b) by 395 days.

(21) Appl. No.: 12/612,034

(22) Filed: Nov. 4, 2009

(65) Prior Publication Data

US 2010/0119800 A1 May 13, 2010

(30) Foreign Application Priority Data

Nov. 10, 2008 (JP) ................................ 2008-287691
Jul. 1, 2009 (JP) ................................ 2009-156928

(51) Int. Cl.
*C01D 15/02* (2006.01)
*C01G 33/00* (2006.01)

(52) U.S. Cl.
USPC ........................... 264/650; 264/638; 264/639

(58) Field of Classification Search
USPC ......................................... 264/638, 639, 650
See application file for complete search history.

(56) References Cited

U.S. PATENT DOCUMENTS

| | | | | |
|---|---|---|---|---|
| 4,710,227 A * | 12/1987 | Harley et al. | ................... | 149/47 |
| 4,816,072 A * | 3/1989 | Harley et al. | ............ | 106/287.18 |
| 5,527,501 A * | 6/1996 | Sawada et al. | ................. | 264/608 |
| 5,900,223 A * | 5/1999 | Matijevic et al. | ............. | 423/263 |
| 6,093,338 A | 7/2000 | Tani et al. | | |
| 7,414,352 B2 | 8/2008 | Nanataki et al. | | |
| 7,417,361 B2 | 8/2008 | Nanataki et al. | | |
| 8,158,255 B2 * | 4/2012 | Yokoyama et al. | ............ | 428/402 |
| 8,211,328 B2 * | 7/2012 | Yura et al. | ................. | 252/62.9 R |
| 2002/0064682 A1 * | 5/2002 | Yano et al. | ..................... | 428/690 |
| 2004/0188657 A1 * | 9/2004 | Takai | ............................. | 252/500 |
| 2004/0189751 A1 * | 9/2004 | Kanno et al. | ..................... | 347/68 |
| 2004/0253746 A1 * | 12/2004 | Nakagawa et al. | ................ | 438/3 |
| 2005/0127780 A1 * | 6/2005 | Ifuku et al. | .................... | 310/311 |
| 2005/0194625 A1 * | 9/2005 | Nakagawa | ..................... | 257/295 |
| 2006/0138907 A1 * | 6/2006 | Koizumi et al. | .............. | 310/363 |
| 2008/0206561 A1 * | 8/2008 | Yokoyama et al. | ............ | 428/402 |
| 2008/0290316 A1 * | 11/2008 | Katayama et al. | ..... | 252/62.9 PZ |

(Continued)

FOREIGN PATENT DOCUMENTS

| | | |
|---|---|---|
| JP | 2006-185940 A1 | 7/2006 |
| JP | 2006-185950 A1 | 7/2006 |

(Continued)

OTHER PUBLICATIONS

Extended European Search Report dated Oct. 8, 2012.

*Primary Examiner* — Joseph S Del Sole
*Assistant Examiner* — Russell Kemmerle, III
(74) *Attorney, Agent, or Firm* — Burr & Brown

(57) ABSTRACT

A ceramic sheet is produced by a method in which inorganic particles including, as a main component, an oxide represented by general formula $ABO_3$ and containing a volatile component are mixed such that the A/B ratio is 1.05 or more, the inorganic particles are formed into a self-supported planar shaped body with a thickness of 30 μm or less, and the shaped body is fired, without an inactive layer or with an inactive layer which does not substantially react with the shaped body and is disposed adjacent to the shaped body, at a temperature-rising rate of 30° C./min or more in a temperature range which is equal to or higher than a temperature at which the volatile component is volatilized.

12 Claims, 8 Drawing Sheets

(56) References Cited

U.S. PATENT DOCUMENTS

| | | | |
|---|---|---|---|
| 2009/0185971 A1* | 7/2009 | Yokoyama et al. | 423/594.3 |
| 2009/0189489 A1* | 7/2009 | Yura et al. | 310/358 |
| 2009/0242099 A1* | 10/2009 | Nagaya et al. | 156/89.12 |
| 2009/0325782 A1* | 12/2009 | Venkataramani et al. | 502/2 |
| 2010/0244632 A1* | 9/2010 | Maekawa et al. | 310/360 |
| 2011/0274614 A1* | 11/2011 | Lamminmaki et al. | 423/598 |

FOREIGN PATENT DOCUMENTS

| | | |
|---|---|---|
| JP | 1 972 604 A1 | 9/2008 |
| JP | 1 975 137 A1 | 10/2008 |
| WO | 2008/032500 A1 | 3/2008 |

* cited by examiner

Fig. 3
Experimental example 10
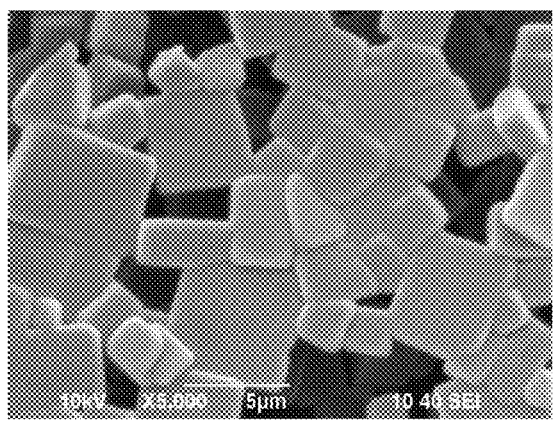
Experimental example 15
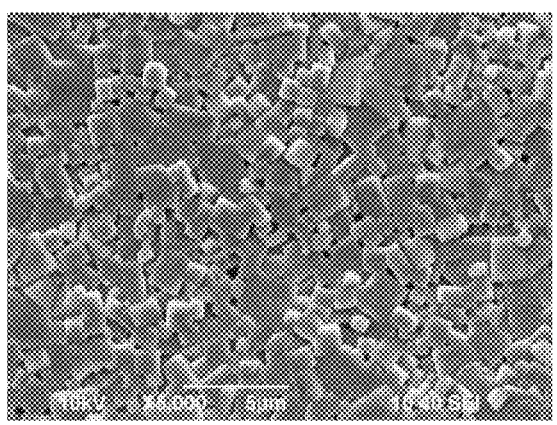
Experimental example 23
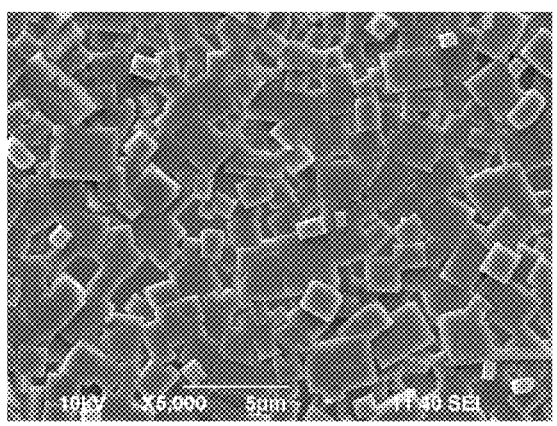

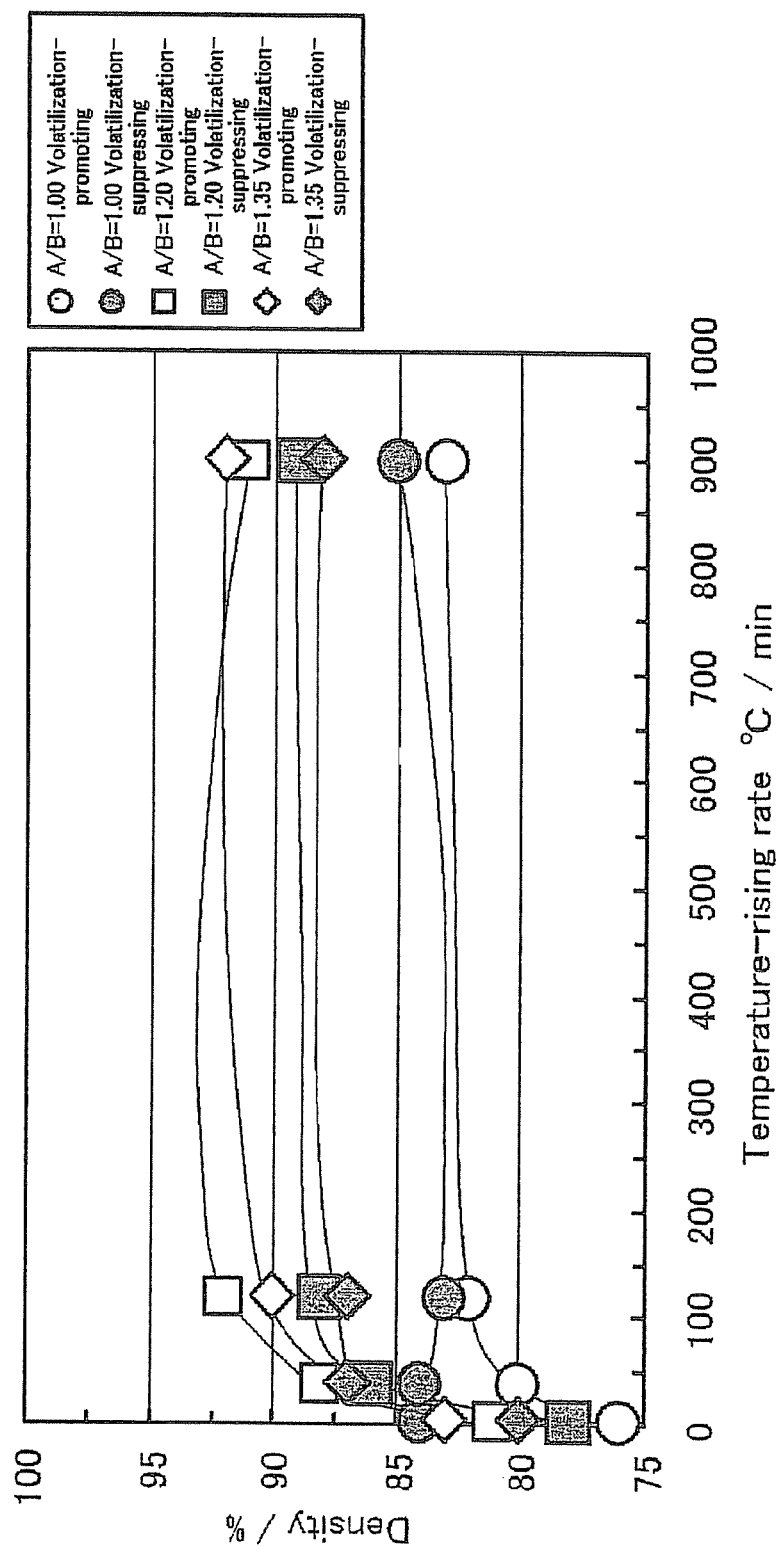

CERAMIC SHEET AND METHOD FOR PRODUCING THE SAME

BACKGROUND OF THE INVENTION

1. Field of the Invention

The present invention relates to ceramic sheets and methods for producing the same. More particularly, the invention relates to piezoelectric/electrostrictive ceramic sheets.

2. Description of the Related Art

To date, piezoelectric ceramics whose properties are improved by aligning the orientations of tabular grains have been proposed. For example, a piezoelectric ceramic having crystal grains whose grain diameters in a width direction are larger than those in a thickness direction when observed in a cross section in the thickness direction has been proposed (refer to Patent Documents 1 and 2). Furthermore, piezoelectric ceramics whose piezoelectric properties are further improved by increasing the degree of orientation of a specific crystal plane in the crystals have been proposed. For example, a piezoelectric ceramic has been proposed, which is produced by forming a template material, whose grains are tabular and in which a specific crystal plane is grown, by firing at 1,000° C. to 1,100° C. for 5 hours, adding a matrix material and an additive to the template material, shaping the resulting mixture such that the template material is arranged in a predetermined direction, and sintering under heating the shaped body so that the matrix material is oriented (refer to Patent Documents 3 and 4).

PRIOR ART DOCUMENTS

Patent Document 1: Japanese Unexamined Patent Application Publication No. 2006-185940
Patent Document 2: Japanese Unexamined Patent Application Publication No. 2006-185950
Patent Document 3: EP Publication No. 1975137
Patent Document 4: EP Publication No. 1972604

SUMMARY OF THE INVENTION

However, in the piezoelectric ceramic described in each of Patent Documents 1 and 2, when the intended piezoelectric material is made flat, firing is performed for two hours under coexistence of a material having the same composition as the piezoelectric material, the process is cumbersome, and the firing time is long, requiring a large amount of energy. Furthermore, in each of Patent Documents 3 and 4, the template material is formed by firing for as long a time as possible (e.g., 5 hours), and a larger amount of firing energy is required to enhance the degree of orientation, thus decreasing production efficiency. Furthermore, in each of Patent Documents 3 and 4, since the template material is subjected to firing for a long period of time, pore growth is promoted, resulting in a decrease in the density of the material.

The present invention has been achieved in view of the problems described above, and it is a main object of the invention to provide a ceramic sheet in which energy consumption during the production can be further reduced, the density can be increased, and the degree of crystallographic orientation can be further enhanced, and a method for producing the ceramic sheet.

In order to achieve the above-mentioned object, the present inventors have made an attempt in which inorganic particles including, as a main component, an oxide represented by general formula $ABO_3$ and containing a volatile component are mixed such that the A/B ratio is 1.05 or more, the inorganic particles are formed into a self-supported planar shaped body with a thickness of 30 μl or less, and the shaped body is fired, without an inactive layer or with an inactive layer which does not substantially react with the shaped body and is disposed adjacent to the shaped body, at a temperature-rising rate of 30° C./minor more in a temperature range which is equal to or higher than a temperature at which the volatile component volatilizes. As a result, it has been found that energy consumption during the production can be further reduced, the density can be increased, and the degree of orientation of crystals contained in the sheet can be further increased, and thus the present invention has been completed.

In an aspect of the present invention, a ceramic sheet is self-supported and planar and has a thickness of 30 μm or less, wherein the number of crystal grains present in the thickness direction of the sheet at any one point is substantially one, a surface of the sheet including a specific crystal plane of the crystal grains, the sheet has a density of 85% or more, the density being defined as the ratio of the area of the crystal grains to the total area, and the degree of orientation of the sheet measured by the Lotgering method is 40% or more.

In another aspect of the present invention, a method for producing a ceramic sheet, which is self-supported and planar, includes a raw material synthesis step of synthesizing inorganic particles by mixing raw materials to form an oxide represented by general formula $ABO_3$ such that the ratio of the A site to the B site, the A/B ratio, is 1.05 or more, a shaping step of forming the synthesized inorganic particles into a self-supported planar shaped body with a sheet thickness of 30 μm or less, and a firing step of firing the shaped body, without an inactive layer or with an inactive layer which does not substantially react with the shaped body and is disposed adjacent to the shaped body, at a temperature-rising rate of 30° C./min or more at least in a temperature range which is equal to or higher than a predetermined temperature.

In the method for producing a ceramic sheet according to the present invention, energy consumption during the production can be further reduced, the density can be increased, and the degree of crystallographic orientation can be further enhanced. The reason for such effects is not clear, but can be presumed as follows. For example, since the planar shaped body with a thickness of 30 μm or less is fired, crystal grain growth easily occurs in the surface direction of the sheet, and the degree of orientation can be further enhanced. Furthermore, in the oxide represented by general formula $ABO_3$, the element in the A site, which is generally volatile, is believed to function as a flux that activates the movement of atoms on the surface of the grains, and by mixing a large amount of the element in the A site during the raw material synthesis step and by increasing the temperature-rising rate (to 30° C./min or more), grain growth can rapidly proceed while the excess amount of the element in the A site is volatilized at a higher temperature. Thus, the orientation is believed to be further enhanced in a short period of time. Consequently, since the total firing time can be shortened, energy consumption during the production can be further reduced, pore growth, which may be caused by firing for a long period of time, can be more suppressed, and the density can be further prevented from decreasing. Furthermore, in the ceramic sheet produced by this production method, the number of crystal grains present in the thickness direction of the sheet at any one point is substantially one, a surface of the sheet including a specific crystal plane of the crystal grains, the sheet has a high density of 85% or more, the density being defined as the ratio of the area of the crystal grains to the total area, and the degree of orientation of the sheet measured by the Lotgering method is high at 40% or more.

Furthermore, in the oxide represented by general formula $ABO_3$, the element in the A site added in excess provides, in addition to a function of compensating for the volatile component, an effect of promoting grain growth (orientation). Therefore, it is presumed that, by increasing the temperature rapidly, a dense, oriented sheet can be obtained for a short period of time. In this regard, in a material other than the material represented by general formula $ABO_3$, it is expected that the same effect can be obtained if a grain growth (orientation) promoter is added and the temperature is increased rapidly. As the grain growth promoter, as in the element in the A site added to general formula $ABO_3$, a material or a material composed of a constituent element which has a low melting point and which is volatile is suitable because the properties are not adversely affected.

BRIEF DESCRIPTION OF THE DRAWINGS

FIG. 3 shows SEM photographs in Experimental Examples 10, 15, and 23;

FIG. 8 is a graph showing the relationship between the density and the temperature-rising rate.

DETAILED DESCRIPTION OF THE INVENTION

Figure 1:
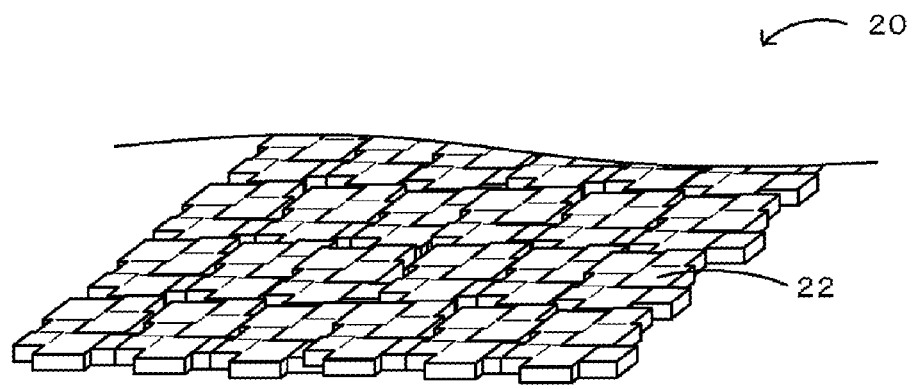
FIG. 1 is a schematic view showing an example of a ceramic sheet 20 according to an embodiment of the present invention.

Now, embodiments for carrying out the present invention will be described with reference to the drawings. FIG. 1 is a schematic view showing an example of a ceramic sheet 20 according to an embodiment of the present invention. In the ceramic sheet 20 according to the present invention, the thickness of the sheet is 30 μm or less, a surface of the sheet, which is a surface having a larger area, includes a specific crystal plane, and the number of the crystal grain 22 present in the thickness direction of the sheet at any one point is substantially one. Although the thickness of the ceramic sheet 20 is specified to be 30 μm or less, the thickness of the sheet is preferably 10 μm or less, and more preferably 5 μm or less, and most preferably 2 μm or less. Furthermore, the thickness of the sheet is preferably 0.1 μm or more. If the thickness of the sheet is 0.1 μm or more, a self-supported planar sheet can be easily formed. If the thickness of the sheet is 10 μm or less and 5 μm or less, the degree of orientation can be further increased. In this description, the term "self-supported sheet" is defined as a sheet obtained by firing a sheet-like shaped body formed with a thickness of 30 μm or less, and does not include a sheet which is stacked on another sheet and fired, a sheet which is bonded on a substrate and fired, or a film formed by sputtering, a sol-gel process, aerosol deposition, printing, or the like on a substrate and supported by the substrate. Note that the "self-supported sheet" includes a sheet that has been bonded or formed on a substrate and separated from the substrate before or after firing.

In crystal grains contained in the ceramic sheet 20 of the present invention, preferably, the crystal grain length in a direction parallel to the surface of the sheet is larger than the crystal grain length in the thickness direction. In such a structure, the crystal grains are easily oriented. Furthermore, the aspect ratio of the crystal grain 22 is preferably 2 or more, more preferably 3 or more, and most preferably 4 or more. If the aspect ratio is 2 or more, the crystal grain 22 is easily oriented. Furthermore, the aspect ratio is preferably 100 or less. The aspect ratio is determined by the method described below. First, a SEM photograph is taken by a scanning electron microscope, and the thickness of the ceramic sheet is determined from the SEM photograph. Next, the sheet surface of the ceramic sheet is observed, and in a field of view which includes about 20 to 40 crystal grains, an area S per grain is calculated using the formula {(area of the field of view)/(number of grains)}. Assuming that each grain has a circular shape, a grain diameter is calculated using equation (1) below. The value obtained by dividing the grain diameter by the thickness of the sheet is defined as the aspect ratio.

$$\text{Grain Diameter} = 2\sqrt{S/\pi} \qquad \text{Equation (1)}$$

In the ceramic sheet 20 of the present invention, the degree of orientation of the specific crystal plane measured by the Lotgering method is preferably 40% or more, and more preferably 75% or more. The degree of orientation of 40% or more is sufficient, for example, to obtain a crystallographically-oriented ceramic by crushing the ceramic sheet 20 and forming the crushed ceramic into a shaped body such that the crystal grains have a secondary orientation. This is because the degree of crystallographic orientation can be further increased when the secondary orientation is performed. More preferably, the degree of orientation is 60% or more. Thereby, higher properties can be obtained. The specific crystal plane may be the pseudocubic (100) plane in the surface of the ceramic sheet. The term "pseudocubic (100)" means that although an isotropic perovskite-type oxide has a structure, such as a tetragonal, rhombic, or trigonal structure, which is slightly distorted from the cubic structure, since the amount of distortion is very small, the pseudocubic structure is considered to be a cubic structure and designated by the Miller indices. Here, in the measurement of the degree of orientation by the Lotgering method, XRD diffraction patterns of an intended ceramic sheet are measured and the degree of orientation is obtained using equation (2) below. In equation (2), $\Sigma I(HKL)$ is the sum of X-ray diffraction intensities of all crystal planes (hkl) measured in the ceramic sheet; $\Sigma I_0(hkl)$ is the sum of X-ray diffraction intensities of all crystal planes (hkl) measured in a non-oriented ceramic sheet having the same composition as the ceramic sheet; $\Sigma'I(HKL)$ is the sum of X-ray diffraction intensities of crystallographically equivalent specific crystal planes (e.g., (100) plane) measured in the ceramic sheet; and $\Sigma'I_0(HKL)$ is the sum of X-ray diffraction intensities of specific crystal planes measured in a non-oriented ceramic sheet having the same composition as the ceramic sheet. In the measurement of XRD diffraction patterns, when a ceramic sheet has waviness, measurement is performed after the ceramic sheet is flattened based on a portion with the lowest wave height. Furthermore, when reducing the thickness is difficult, such as in the case where a ceramic sheet is roll-shaped, the ceramic sheet is crushed to such an extent that the aspect ratio is not less than 3 to obtain a crushed material. The crushed material is placed in a solvent, such as an alcohol, in an amount of 1% to 10% by weight, and dispersed, for example, using an ultrasonic wave for 30 minutes. The dispersion liquid is dispersed on a substrate made of glass or the like, in the form of a thin layer by spin-coating at 1,000 to 4,000 rpm such that the crystal grains are prevented from overlapping each other as much as possible and that the crystal planes included in the crushed material are in parallel to the surface of the substrate. XRD diffraction patterns are measured in such a state.

Degree of orientation =  Equation (2)

$$\frac{\frac{\sum' I(HKL)}{\sum I(hkl)} - \frac{\sum' I_0(HKL)}{\sum I_0(hkl)}}{1 - \frac{\sum' I_0(HKL)}{\sum I_0(hkl)}} \times 100\%$$

In the ceramic sheet 20 of the present invention, the number of the crystal grain 22 present in the thickness direction of the sheet at any one point is substantially one. The reason for this is that since the thickness of the ceramic sheet is 30 μm or less, grains grow to a height substantially corresponding to the thickness of the sheet. In the ceramic sheet 20, since the material present in the thickness direction of the sheet is limited, when grain growth occurs due to firing or the like, the number of the crystal grain 22 present in the thickness direction of the sheet at any one point is substantially one. Furthermore, since grain growth is promoted in the surface direction of the sheet rather than the thickness direction of the sheet, a flat crystal grain 22 is aligned in the surface direction of the sheet and a specific crystal plane is oriented in the surface direction of the sheet. Here, the expression "the number of crystal grains present in the thickness direction of the sheet at any one point is substantially one" means that even if crystal grains overlap in some part, in most parts of the ceramic sheet, crystal grains do not overlap and the number of crystal grains present in the thickness direction of the sheet at any one point is only one. This does not cover the case where in most parts of the ceramic sheet, such as in the center region, two or more crystal grains overlap with each other, and only in the end region, the number of crystal grains present in the thickness direction of the sheet at any one point is one. In the ceramic sheet 20 of the present invention, crystal grains may overlap or the crystal planes of the crystal grains may be oriented in different directions locally in some part because the crystal grain 22 does not reach the extremity of the thickness direction of the ceramic sheet during grain growth or crystal planes are oriented in different directions. However, generally, the number of crystal grains present in the thickness direction at any one point is only one. In the ceramic sheet 20, the percentage of the portion which includes only one crystal grain 22 in the thickness direction at any one point is preferably 70% or more, more preferably 80% or more, and most preferably 90% or more, in terms of area ratio. In the ceramic sheet, the percentage of the portion in which crystal grain overlap is a fraction of the whole (e.g., 30% or less in terms of area ratio), and at grain boundaries where crystal grains are joined together, such a portion can be relatively easily separated by crushing.

In the ceramic sheet 20 of the present invention, the crystal grain 22 may be composed of inorganic particles that grow into crystal grains with an isotropic and polyhedral shape, or may be composed of inorganic particles that grow into crystal grains with an anisotropic shape. Preferably, the crystal grains are composed of inorganic particles that grow into crystal grains with an isotropic and polyhedral shape. The fact that the inorganic particles grow into crystal grains with isotropic and polyhedral shape suggests the possibility that a specific crystal plane may be grown depending on the situation. Here, even if inorganic particles that grow into crystal grains with an isotropic and polyhedral shape are included, since grain growth in the thickness direction of the sheet is limited and grain growth is more promoted in the surface direction of the sheet, a specific crystal plane grows in the surface of the sheet, and thus the aspect ratio and the degree of orientation are increased. Among the polyhedral shapes, a hexahedral shape is most preferred. In the case of a hexahedron, in grains having two faces parallel to the surface of the sheet, four faces other than the two faces are included as the growing planes in all directions in a shaped body. Thus, grain growth occurs isotropically, and the remaining two faces present in the surfaces of the sheet expand naturally. Consequently, it is possible to easily obtain grains having a large aspect ratio, which is preferable. Furthermore, the crystal grains are preferably composed of an oxide having a perovskite structure. In some oxides having the perovskite structure, grains grow into a pseudocubic structure in the shape of a dice. The (100) plane grows along the surface of the sheet and the (100) crystal plane is easily oriented in a direction perpendicular to the surface of the sheet, which is preferable. On the other hand, even when the crystal grains are composed of inorganic particles that grow into crystal grains with an anisotropic shape, since grain growth in the thickness direction of the sheet is limited and grains grow in a direction parallel to the surface of the sheet. Thus, the aspect ratio and the degree of orientation are increased.

In the ceramic sheet 20 of the present invention, the crystal grains 22 may include an oxide represented by general formula $ABO_3$ as a main component, wherein the A site contains at least one element selected from the group consisting of Li, Na, K, Bi, and Ag, and the B site contains at least one element selected from the group consisting of Nb, Ta, and Ti. Particularly preferably, the oxide is $(Li_XNa_YK_Z)Nb_MTa_NO_3$, $(Bi_XNa_YK_ZAg_N)TiO_3$, or the like (wherein X, Y, Z, M, and N are arbitrary numbers). Alternatively, the crystal grains 22 may include an oxide represented by general formula $ABO_3$ as a main component, wherein the A site contains Pb, and the B site contains at least one element selected from the group consisting of Mg, Zn, Nb, Ni, Ti, and Zr. Thereby, at a thickness of 30 μm or less, preferably at a thickness of 10 μm or less, crystal grains are easily obtained. The crystal grains may contain an element other than the elements described above. Here, in the crystal grains before firing (i.e., before the firing step which will be described below), the A/B ratio is 1.05 or more, preferably 1.5 or less, and more preferably 1.20 to 1.35. The element in the A site, which is generally volatile, is believed to function as a flux that activates the movement of atoms on the surface of the grains. Therefore, using a large amount of the element in the A site before firing and by increasing the temperature-rising rate, the excess amount of the element in the A site is volatilized at a higher temperature, and grain growth can proceed rapidly for a short period of time. Thus, the aspect ratio and the degree of orientation of the resulting crystal grains can be increased.

In the ceramic sheet 20 of the present invention, the density of the sheet is 85% or more, and preferably 90% or more. The density of the sheet is defined as the ratio of the area of the crystal grains to the total area in a visual field. The density is determined by a method in which the surface of the sheet is photographed, the total area, the area of the crystal plane region of the crystal grains, and the area of the void region are determined, and the density is calculated using the formula (area of crystal planes)/(total area)×100. When the density of the sheet is 85% or more, production efficiency can be increased. For example, handleability of the ceramic sheet can be improved. Furthermore, in the case where the ceramic sheet is crushed and used as a template for a crystallographically-oriented ceramic, plate-like polycrystalline particles having a large aspect ratio and a uniform particle diameter, each of which includes a plurality of crystal grains, are easily obtained, and the plate-like polycrystalline particles can be easily arranged in a predetermined direction. Furthermore, it is possible to suppress generation of pores among crystal grains in the plate-like polycrystalline particles, and another material (raw material powder serving as a matrix) is easily entering the pores. Thus, it is possible to increase the density of the crystallographically-oriented ceramic.

A method for producing a ceramic sheet according to the present invention includes (1) a raw material synthesis step of synthesizing inorganic particles which are raw materials for a the ceramic sheet, (2) a shaping step of a sheet, and (3) a firing step of the shaped sheet. The individual steps will be described below in that order.

(1) Raw Material Synthesis Step

Examples of inorganic particles that can be used for the ceramic sheet include inorganic particles that grow into crystal grains with an anisotropic shape under predetermined firing conditions, namely, the growth form under predetermined firing conditions is crystal grains with an anisotropic shape; and inorganic particles that grow into crystal grains with an isotropic and polyhedral shape under predetermined firing conditions, namely, the growth form under predetermined firing conditions is crystal grains with an isotropic and polyhedral shape. In the present invention, since a sheet-like shaped body with a thickness of 30 μm or less is fired to cause grain growth, grain growth in the thickness direction of the shaped body is limited, and grain growth is more promoted in the surface direction of the sheet. Therefore, it is possible to form a ceramic sheet composed of grains with a large aspect ratio in which a specific crystal plane has been grown, even when using inorganic particles that grow into crystal grains with an isotropic and polyhedral shape, for example, a cube, under predetermined conditions. Here, the expression "growth form under predetermined firing conditions" is defined as the morphology observed when crystals of inorganic particles come to equilibrium with each other under given heat-treating conditions, which is, for example, obtained by observing the shape of grains at a bulk surface when it is crystallized by firing. Furthermore, the term "anisotropic shape" refers to a shape in which the ratio of major axis length to minor axis length (aspect ratio) is large (e.g., with an aspect ratio of 2 or more), such as a tabular, strip-like, columnar, needle-like, or flake-like shape. Furthermore, the "isotropic and polyhedral" shape means, for example, a cubic shape. In general, with respect to the morphology of crystal grains formed by grain growth, if the grain growth temperature is sufficiently low, for example, 400° C. or less, compared with the melting point or decomposition temperature of the solid, the crystal grains are virtually spherically-shaped. In spite of the fact that intrinsically, the atom arrangement is anisotropic and the growth rate differs depending on the crystal plane, grains grow into a spherical shape. The reason for this is that atoms of solids are very difficult to move. On the other hand, if the grain growth temperature is close to the melting point or decomposition temperature of the solid, for example, if the difference in temperature is 200° C. or less, the movement of atoms at the surface of growing grains becomes active, and surface morphology resulting from the crystal structure appears. That is, as grains grow, a difference occurs in the growth rate depending on the crystal plane. Slowly growing crystal planes develop, while rapidly growing crystal planes diminish or disappear. The morphology determined by the difference in plane growth rate is referred to as the growth form. In order to achieve an anisotropic shape or polyhedral shape as the growth form, in addition to the material in which grain growth temperature is close to the melting point or decomposition temperature of the solid as described above, a system in which a low-melting-point compound, such as glass, is added as a flux and grains are grown through the flux is preferably selected. The reason for this is that by adding the flux, the movement of elements constituting the solid at the surface of grains becomes active. As the inorganic particles that grow into a polyhedral shape, inorganic particles that grow into a hexahedral shape can be used. In the case of a hexahedron, in grains having two faces parallel to the surface of the planar sheet, four faces other than the two faces are included as the growing planes in all directions in a shaped body. When grain growth occurs isotropically, the two faces present in the surfaces of the sheet expand naturally. Consequently, it is possible to easily obtain grains having a large aspect ratio, which is preferable. For the same reason, a columnar shape, such as a hexagonal columnar shape or octagonal columnar shape, may also be used. Additionally, in order to obtain crystal grains having a large aspect ratio, an additive which accelerates grain growth may be used. Preferably, the inorganic particles form an oxide having a perovskite structure.

As the inorganic particles used as raw materials, inorganic particles which contain a volatile component, the volatilization of which is promoted at a predetermined temperature or higher, and which, after firing, form crystal grains having an oxide represented by general formula $ABO_3$ as a main component are used. The volatile component may be, for example, an element in the A site. Preferably, in the oxide represented by general formula $ABO_3$, the A site contains at least one element selected from the group consisting of Li, Na, K, Bi, and Ag, and the B site contains at least one element selected from the group consisting of Nb, Ta, and Ti. For example, when inorganic particles which form $NaNbO_3$ in which part of the A site is replaced with Li, K, or the like and part of the B site is replaced with Ta or the like, i.e., $(Li_X Na_Y K_Z)Nb_M Ta_N O_3$ (wherein X, Y, Z, M, and N are arbitrary numbers), are used, the growth form at 900° C. to 1,300° C. is a cubic shape, which is preferable. An element other than the elements described above may also be added. Furthermore, in inorganic particles which form crystal grains having $(Bi_{0.5}Na_{0.5-x}K_x)TiO_3$ as a main component, when X>0.01, the growth form is a cubic shape, which is preferable. Furthermore, inorganic particles which form crystal grains including an oxide represented by general formula $ABO_3$, wherein the A site contains Pb as a main component and the B site contains at least one element selected from the group consisting of Mg, Zn, Nb, Ni, Ti, and Zr, are also preferable. Furthermore, when glass having a melting point of 1,000° C. or lower, such as lead borate glass, zinc borate glass, borosilicate glass, lead silicate glass, zinc silicate glass, or bismuth silicate glass, is added as a flux in an amount of 0.1% by weight or more, the growth form at 900° C. to 1,300° C. is more likely to be a cubic shape, which is preferable. In this case, in view of dispersibility of glass, preferably, instead of forming glass powder directly into a sheet, calcination is performed so that the glass is dispersed sufficiently, the calcined material is pulverized, and using the pulverized powder, the ceramic sheet is formed. When inorganic particles which form an oxide represented by general formula $ABO_3$ are used, raw materials are mixed such that the ratio of the A site to the B site, the A/B ratio, is 1.05 or more. Preferably, the raw materials are mixed such that the A/B ratio is 1.5 or less, and more preferably, the raw materials are mixed such that the A/B ratio is 1.20 to 1.35. When the A/B ratio is in the range of 1.05 to 1.5, by increasing the temperature-rising rate and volatilizing the excess amount of the element in the A site at a higher temperature, the excess amount of the element in the A site activates the movement of atoms on the surface of the grains, and grain growth can proceed rapidly for a short period of time. Thus, the aspect ratio and the degree of orientation of the crystals contained in the ceramic sheet after firing can be increased. In this range, the alkaline component and the like which volatilize during firing can be compensated for, which is preferable.

In the raw material synthesis step, preferably, raw materials for the inorganic particles are pulverized and mixed, the mixed powder is calcined, and the resulting inorganic particles are further pulverized. As the raw materials for the inorganic particles, oxides, hydroxides, carbonates, sulfates, nitrates, tartrates, or the like of the desired components may be used. Preferably, oxides and carbonates are mainly used. The calcined temperature is preferably set to the temperature to promote decomposition of raw materials. In the pulverization of the inorganic particles, the particle diameter is preferably set according to the thickness of the sheet. The median diameter (D50) of the inorganic particles is preferably 2% or more, and more preferably 5% or more, of the thickness of the sheet. The median diameter (D50) of the inorganic particles is preferably 60% or less of the thickness of the sheet. If the median diameter is 2% or more of the thickness of the sheet, pulverization can be easily performed. If the median diameter is 5% or more of the thickness of the sheet, pulverization can be more easily performed. If the median diameter is 60% or less of the thickness of the sheet, the thickness of the sheet can be easily adjusted. The particle diameter is determined using a method in which inorganic particles are dispersed in a dispersion medium (organic solvent, water, or the like), and the particle diameter is measured using a laser diffraction/scattering particle size distribution analyzer. The pulverization of the inorganic particles is preferably conducted by wet pulverization. For example, a ball mill, a bead mill, a trommel, an attritor, or the like may be used.

(2) Shaping Step of Sheet

The inorganic particles are formed into a self-supported planar shaped body with a sheet thickness of 30 μm or less, more preferably 10 μm or less. The sheet shaping can be conducted, for example, by a doctor-blade method using a slurry containing the inorganic particles, or extrusion molding using a puddle containing the inorganic particles. When the doctor-blade method is used, for example, a slurry is applied to a flexible plate (e.g., organic polymer plate, such as PET film), the applied slurry is solidified by drying to form a shaped body, and the shaped body is separated from the plate. Thereby, a shaped body of the ceramic sheet before firing may be obtained. When a slurry or a puddle is prepared before shaping, the inorganic particles may be dispersed in an appropriate dispersion medium, and a binder, a plasticizer, or the like may be appropriately added thereto. The slurry is preferably adjusted so as to have a viscosity of 500 to 700 cP and is preferably defoamed under reduced pressure. The thickness of the sheet is 30 μm or less, preferably 10 μm or less, and more preferably 5 μm or less, and most preferably 2 μm or less. At 30 μm or less, a high degree of orientation can be obtained, and at 10 μm or less and 5 μm or less, a higher degree of orientation can be obtained. The thickness of the sheet is preferably 0.1 μm or more. If the thickness of the sheet is 0.1 μm or more, a self-supported planar sheet can be easily formed. Examples of other methods that may be used include high-speed spraying of particles, such as aerosol deposition; and a method in which a film is formed on a substrate made of a resin, glass, ceramic, metal, or the like by a vapor-phase method, such as sputtering, CVD, or PVD, and then the film is separated from the substrate to obtain a shaped body of the ceramic sheet before firing. In this case, since the density of the shaped body before firing can be increased, grain growth proceeds at low temperature, volatilization of constituent elements can be prevented, and the resulting ceramic sheet has high density, all of which are advantageous.

(3) Firing Step of Shaped Sheet

The shaped body obtained in the shaping step is fired without an inactive layer or with an inactive layer (e.g., fired ceramic plate, Pt plate, carbon plate, graphite plate, molybdenum plate, or tungsten plate) which does not substantially react with the shaped body and is disposed adjacent to the shaped body. For example, a method may be used in which green sheets and inactive layers are alternately stacked and then firing is performed, the inactive layers being composed of alumina, zirconia, spinel, carbon, graphite, molybdenum, tungsten, platinum, or the like which is inactive at the firing temperature of the shaped body. Alternatively, a method may be used in which a shaped sheet is stacked on an inactive sheet, the resulting laminate is formed into a roll, and then firing is performed. Alternatively, a method may be used in which a shaped body in the form of a sheet is formed on an inactive layer, and after firing, the sheet is separated from the inactive layer. Alternatively, a method may be used in which a sheet-like shaped body is formed on an inactive layer, and after firing, the inactive layer is removed. For example, when graphite is used for the inactive layer, a method may be used in which firing is performed under a non-oxidizing atmosphere (e.g., in nitrogen) to obtain a desired ceramic sheet in the presence of the inactive layer, then heat treatment is performed again under an oxidizing atmosphere (e.g. in air) at a temperature lower than that in the previous firing, and thereby graphite is removed by burning.

Figure 2:
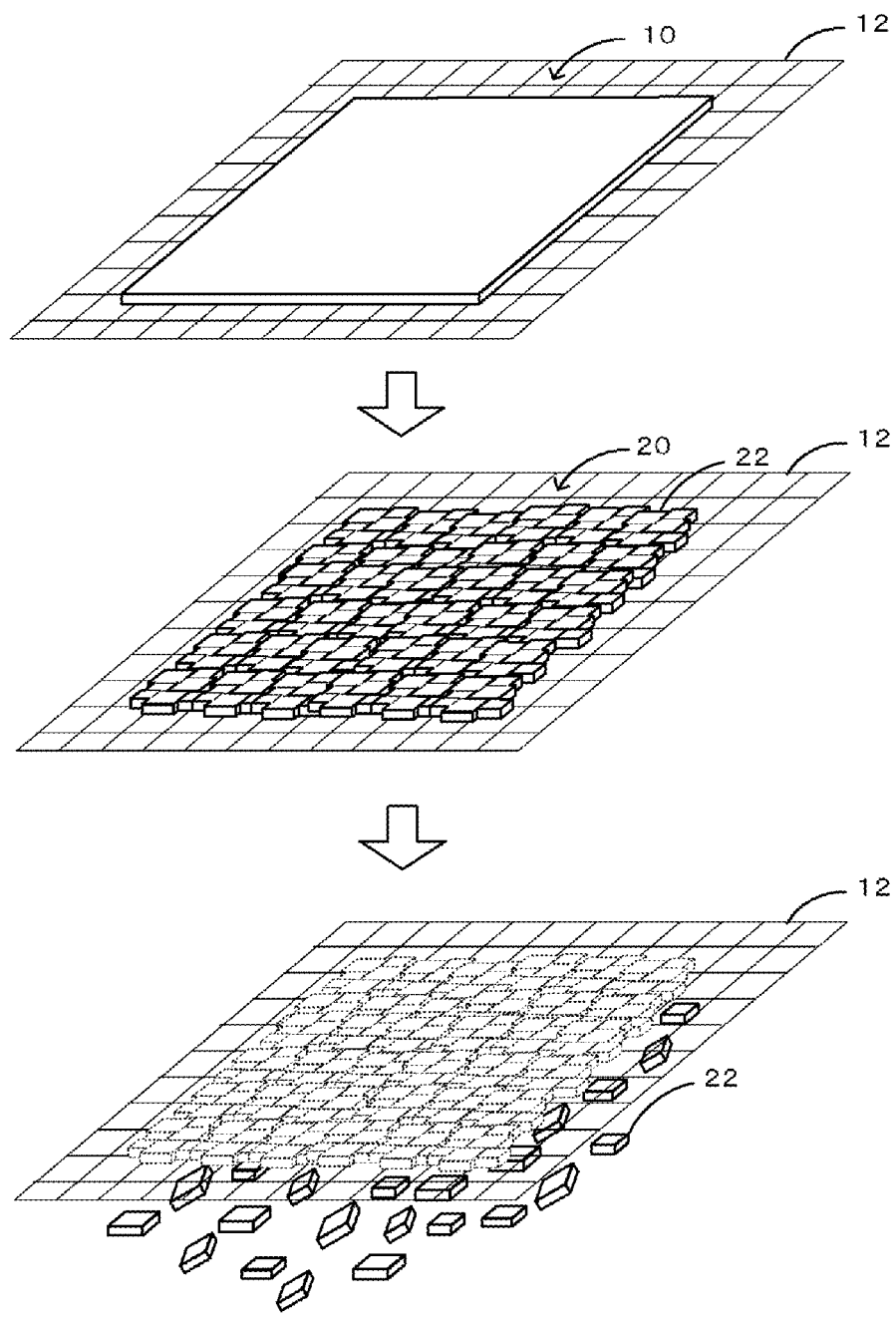
FIG. 2 is a schematic view showing a process of firing a shaped sheet 10 on a setter 12 having a plurality of through-holes.

In the firing step, preferably, the shaped body of the ceramic sheet before firing (also referred to as the "shaped sheet") is fired in such a manner that the shaped sheet is placed on (disposed adjacent to) an inactive layer in which the contact area with the shaped sheet is decreased. When firing is performed using the inactive layer in which the contact area with the shaped sheet is decreased, the shaped sheet may be placed on an inactive layer having at least one of a region which is in point contact with the shaped sheet and a region which is in line contact with the shaped sheet. For example, the shaped sheet may be fired while being placed on an inactive layer in which the shaped sheet-placing surface is roughened or an inactive layer which is dimpled. Furthermore, the shaped sheet may be fired while being placed on an inactive layer having a plurality of through-holes, such as a honeycomb-shaped setter or a mesh setter. In such a case, it is possible to further prevent adhesion between the inactive layer and the shaped sheet, and the yield can be increased, for example, compared with the case where the shaped sheet is fired while being placed on a plate-like inactive layer. In particular, when firing is performed at a larger temperature-rising rate, the shaped sheet and the inactive layer more easily adhere to each other. Therefore, it is preferable to perform firing using an inactive layer in which the contact area with the shaped sheet is decreased. Furthermore, since through-holes are provided in the setter, the thermal capacity of the setter can be reduced, and therefore, it is possible to further reduce energy consumption during the production of the ceramic sheet. In addition, a method may be used in which an adhesion prevention material (alumina powder, zirconia powder, or the like) is spread over the sheet-placing surface of an inactive layer, and the shaped sheet is placed thereon when firing is performed. Furthermore, it may be possible to use a method in which mesh-like inactive layers, on each of which the shaped sheet is placed, are stacked and fired, the fired ceramic sheets are crushed by application of water flow or pressure, such as ultrasonic waves, and the crushed ceramic sheets are recovered. In such a case, it is possible to efficiently obtain ceramic sheets (plate-like particles) having the same size as that of the opening of the mesh. The plate-like particles each may contain one or more crystal grains 22. FIG. 2 is a schematic view showing a process of firing a shaped sheet 10 on a setter 12 having a plurality of through-holes. As the setter 12 which is an inactive layer, a noble metal (Pt or the like), a ceramic (alumina or the like), a metal (e.g., Ni, SUS, or Hastelloy), or a ceramic-coated metal can be used. Here, the case will be described where a mesh setter 12 composed of Pt is used, the mesh setter 12 being provided with through-holes having the size capable of producing plate-like particles that can be used in the subsequent process. First, the shaped sheet 10 is placed on the setter 12 (refer to the top of FIG. 2), and firing is performed under the firing conditions, the details of which will be described below. Thereby, grain growth occurs in inorganic particles contained in the shaped sheet 10, and a ceramic sheet 20 containing a plurality of crystal grains 22 oriented in a predetermined direction is obtained (refer to the middle of FIG. 2). In this process, since the contact area between the setter 12 having the through-holes and the shaped sheet 10 is small, it is possible to further prevent the ceramic sheet 20 from adhering to the setter 12. Even if a part of the ceramic sheet 20 adheres to the setter 12, the adhering part can be recovered by crushing and used as plate-shaped particles (refer to the bottom of FIG. 2). In such a manner, the yield in the production of the crystal grains 22 can be further increased.

In the firing step, the temperature is raised at a temperature-rising rate of 30° C./min or more in a temperature range which is equal to or higher than a predetermined temperature. The "predetermined temperature" may be set at a temperature at which volatilization of the volatile component contained in the raw materials is promoted or at a temperature at which organic substances contained in the raw materials are removed (degreasing temperature). It is assumed that, in the raw material synthesis step, raw materials containing a volatile component (e.g., Pb, Na, K, or the like), the volatilization of which is promoted during firing, are mixed. The temperature-rising rate is more preferably in a range of 40° C./min to 900° C./min. As the temperature-rising rate increases, the total firing time can be shortened, and energy consumption during the production can be further reduced. Furthermore, pore growth, which may be caused by firing for a long period of time, can be more suppressed, and the density can be further prevented from decreasing. In the firing step, by raising the temperature at a temperature-rising rate of 30° C./min or more at least in a temperature range which is equal to or higher than the predetermined temperature at which volatilization is promoted, it is considered that reactivity of the inorganic particles is increased and the degree of orientation can be improved. More preferably, firing is also performed at a temperature-rising rate of 30° C./min or more in a temperature range lower than the predetermined temperature at which volatilization is promoted. In such a case, the firing time can be further shortened, which is desirable from the standpoint of energy saving and production efficiency. In the firing step, firing can be performed at such a temperature-rising rate using a batch-type firing furnace, such as an infrared heating furnace, or a continuous firing furnace, such as a tunnel kiln. In addition, the temperature-rising rate is preferably 2,000° C./min or less in view of the limitation in the rate. Furthermore, in the firing step, firing may be performed such that, after the temperature is raised at the temperature-rising rate described above, the shaped body is retained at a predetermined maximum firing temperature for 30 minutes or less. By setting the retention time at the maximum firing temperature to 30 minutes or less, the firing time can be shortened, and energy consumption during the production can be further reduced. Furthermore, pore growth, which may be caused by firing for a long period of time, can be more suppressed, and the density can be further prevented from decreasing. Preferably, the retention time is empirically determined according to the mixing composition of the raw materials.

With respect to the firing conditions of sheet-like shaped body, preferably, the shaped sheet 20 is fired at a temperature that is higher, by 10 percent or more, as the maximum firing temperature, than the firing temperature at which equilibrium-shaped crystals are obtained by firing, for example, at the firing temperature at which densification and grain growth are caused by firing a bulk. At the temperature higher by 10 percent or more, grain growth of the shaped sheet with a thickness of 30 μm or less and 10 μm or less can be promoted sufficiently. Preferably, firing is performed at a high temperature to such an extent that the material of the shaped body is not decomposed. In particular, when the thickness of the sheet is decreased, grain growth does not easily proceed, and therefore, it is preferable to increase the firing temperature. For example, in the firing step of inorganic particles composed of $NaNbO_3$ in which Li, K, or the like is added to the A site and Ta is added to the B site (($Li_XNa_YK_Z)Nb_MTa_NO_3$), the maximum firing temperature is preferably set at 900° C. to 1,250° C., and more preferably set at 950° C. to 1,150° C. At the maximum firing temperature of 900° C. or higher, crystal growth of the particles is promoted, which is preferable. At a temperature of 1,200° C. or less, decomposition of the material can be suppressed. Alternatively, for example, in the firing step of inorganic particles composed of Mg, Nb, or the like is added to the B site $Pb(Zr_{1-X}Ti_X)O_3$ (0≤X≤1), the maximum firing temperature is preferably set at 1,100° C. to 1,400° C., and more preferably set at 1,200° C. to 1,350° C. At the maximum firing temperature of 1,100° C. or higher, crystal growth of the particles is promoted, which is preferable. At a temperature of 1,350° C. or less, decomposition of the material can be suppressed.

In the firing step, preferably, the shaped body is fired in a volatilization-promoting state in which the volatilization of the volatile component is promoted. When the volatilization of the volatile component is further promoted, the movement of atoms on the surface of the grains becomes more active, and it is believed that the grain growth of oriented crystal grains is promoted, which is more preferable. In this case, preferably, in the raw material synthesis step, the raw materials containing a volatile component (e.g., Pb, Na, K, or the like), the volatilization of which is promoted during firing, are mixed, and in the firing step, the temperature is raised at a temperature-rising rate of 30° C./min or more in a temperature range which is equal to or higher than the predetermined temperature at which volatilization of the volatile component is promoted. Examples of the volatilization-promoting state include a state in which firing is performed in a firing furnace that is not closed but has an open system. Alternatively, the shaped body may be fired in a volatilization-suppressing state in which the volatilization of the volatile component (e.g., an alkaline component, Pb, or the like) is suppressed. In such a case, by increasing the temperature-rising rate, the density of the ceramic sheet can be further increased, and energy consumption during the production can be further reduced. For example, in order to suppress volatilization, the shaped body may be fired in a state in which other inorganic particles coexist with the inorganic particles constituting the shaped body, or the shaped body may be placed in a covered sheath or the like and fired in a sealed state. The firing atmosphere may be air. Alternatively, in view of suppression of volatilization of the constituent elements, reactivity with the inactive layer, and the like, the atmosphere may be an oxygen atmosphere; a neutral atmosphere, such as nitrogen; a reducing atmosphere in the presence of hydrogen or a hydrocarbon; or a vacuum. Furthermore, from the standpoint of accelerating in-plane grain growth, firing under pressure, such as hot pressing, may be performed.

In the firing step, in the case where an organic substance, such as a binder, is contained in the shaped body, degreasing may be performed at a predetermined degreasing temperature before the firing is performed. The degreasing temperature is better to be lower than the temperature at which the volatilization of the volatile component is promoted, and may be set, for example, at 700° C. or 600° C. By performing firing in such a matter, the inorganic particles contained in the sheet-like shaped body grow into crystal grains in which the length in the sheet surface direction is larger than the length in the thickness direction, the number of crystal grains 22 present in the thickness direction of the sheet at any one point is one, the density is 85% or more, and the degree of orientation is 40% or more.

The resulting ceramic sheet may be crushed to form powder of crystal grains such that the aspect ratio is not 2 or less, preferably not 3 or less and used as a raw material for a crystallographically-oriented ceramic (template). The crystallographically-oriented ceramic can be formed into any shape, for example, with a size in the thickness direction exceeding 10 μm or 30 μm. That is, the ceramic sheet may be formed in order to obtain crystal grains used in a production process of producing a crystallographically-oriented ceramic. An example of a method for producing a crystallographically-oriented ceramic will be described below. A crystallographically-oriented ceramic may be produced by a method including a mixing step of mixing powder containing the crystal grains obtained from the ceramic sheet, other raw material powder (e.g., non-oriented inorganic particles), and as necessary, a binder, a plasticizer, or the like; and a second shaping step of forming the mixture into a secondary shaped body having a predetermined shape by orientation-shaping (secondary orientation) in which crystal grains are oriented in a predetermined direction. In the powder containing the crystal grains, the individual crystal grains may be separated or some crystal grains may be connected to each other. The orientation-shaping can be performed by the doctor-blade method, extrusion molding, or the like described above. Then, a second firing step is carried out in which the secondary shaped body is fired such that the other raw material powder is oriented in the direction in which the powder of crystal grains is oriented. Thereby, a crystallographically-oriented ceramic is obtained. The firing temperature in the second firing step may be equal to or higher, by 10 percent or more, than the firing temperature at which equilibrium-shaped crystals are obtained under predetermined firing conditions described above. Even when the shaped sheet is fired not in a volatilization-suppressing state, the intended compositional ratio of the crystallographically-oriented ceramic can be achieved by adding the volatilized component in the mixing step or the second shaping step. Furthermore, although a higher degree of orientation of the ceramic sheet is more preferable, since the degree of orientation can be increased by firing after the second orientation, a degree of orientation of 40% or more is sufficient. Alternatively, a crystallographically-oriented ceramic may be produced using the ceramic sheet without crushing. For example, a crystallographically-oriented ceramic may be produced by a method including a stacking step of stacking the ceramic sheet and a raw material powder sheet containing raw material powder to form a secondary shaped body, and a second firing step of firing the secondary shaped body such that the raw material powder is oriented in the direction in which the crystal grains contained in the ceramic sheet is oriented.

In the self-supported planar ceramic sheet according to the embodiment described above, the thickness of the sheet is 30 μm or less, the number of crystal grains present in the thickness direction of the sheet at any one point is one, the surface of the sheet including a specific crystal plane (pseudocubic (100) plane), the density is 85% or more, the density being defined as the ratio of the area of the crystal grains to the total area, and the degree of orientation of the sheet measured by the Lotgering method is 40% or more. Consequently, higher piezoelectric/electrostrictive properties can be obtained. Furthermore, in the method for producing the ceramic sheet, only by forming a shaped body with a thickness of 30 μm or less, or 10 μm or less, and firing the shaped body, orientation can be achieved by simpler processing. Furthermore, since a large amount of the element in the A site, which is generally volatile and functions as a flux that activates the movement of atoms on the surface of the grains, is mixed, by increasing the temperature-rising rate so that the element in the A site is volatilized at a higher temperature, grain growth can rapidly proceed, and the orientation can be further enhanced. Furthermore, since the temperature-rising rate is large, the total firing time can be further shortened, energy consumption during the production can be further reduced, pore growth, which may be caused by firing for a long period of time, can be more suppressed, and the density can be further prevented from decreasing.

It is to be understood that the present invention is not limited to the embodiment described above, and various embodiments within the scope of the technical field of the present invention can be carried out.

For example, in the embodiment described above, the ceramic sheet is crushed and used as a raw material for a crystallographically-oriented ceramic. The ceramic sheet may be used in other applications. For example, ceramic sheets of the present invention can be used for polycrystalline materials composed of a substance, the function or properties of which have crystallographic orientation dependence, such as dielectric materials, pyroelectric materials, piezoelectric materials, ferroelectric materials, magnetic materials, ion-conducting materials, electron-conducting materials, heat-conducting materials, thermoelectric materials, superconducting materials, and abrasion-resistant materials. Specifically, high-performance elements can be obtained by applying the ceramic sheets in various sensors, such as acceleration sensors, pyroelectric sensors, ultrasonic sensors, electric field sensors, temperature sensors, gas sensors, knocking sensors, yaw rate sensors, air bag sensors, and piezoelectric gyro sensors; energy transducers, such as piezoelectric transformers; low-loss actuators or low-loss resonators, such as piezoelectric actuators, ultrasonic motors, and resonators; and other elements, such as capacitors, bimorph piezoelectric elements, vibration pickups, piezoelectric microphones, piezoelectric ignition elements, sonars, piezoelectric buzzers, piezoelectric speakers, oscillators, filters, dielectric elements, microwave dielectric elements, thermoelectric conversion elements, pyroelectric elements, magnetoresistive elements, magnetic elements, superconducting elements, resistance elements, electron-conducting elements, ion-conducting elements, PTC elements, and NTC elements. In such cases, the aspect ratio of crystal grains is appropriately set depending on the application. In addition, the present invention may be applied, for example, to electrode materials for lithium secondary batteries. Specifically, examples of the type of material include lithium cobalt oxide ($LiCoO_2$), lithium nickel oxide ($LiNiO_2$), lithium manganese oxide ($LiMn_2O_4$), ternary ($Li(Ni_xCO_yMn_z)O_2$ (wherein x, y, and z are arbitrary numbers), and lithium iron phosphate ($LiFePO_4$). These electrode materials each contain Li which is a volatile component. Thus, in the application of the present invention, by mixing an excess amount of Li in advance and by firing in a volatilization-promoting state at a predetermined temperature-raising rate or more, it is possible to obtain a dense and highly oriented ceramic sheet in a short period of time.

EXAMPLES

Experimental examples in which ceramic sheets are specifically produced will be described below.

(Synthesis Step of Synthesizing Inorganic Particles)

Powders ($Li_2CO_3$, $Na_2CO_3$, $K_2CO_3$, $Nb_2O_5$, and $Ta_2O_5$) were weighed so as to satisfy the composition $\{Li_{0.07}(Na_{0.5}K_{0.5})_{0.93}\}_{A/B}[Nb_{0.9}Ta_{0.1}]O_3$ (A/B=1.00). The weighed powders, zirconia balls, and ethanol as a dispersion medium were placed in a plastic pot, and wet mixing and pulverization were performed using a ball mill for 16 hours. The resulting slurry was dried using an evaporator and a dryer, and then calcination was performed at 850° C. for 5 hours. The calcined powder, zirconia balls, and ethanol as a dispersion medium were subjected to wet pulverization using a ball mill for 40 hours, followed by drying using an evaporator and a dryer. Thereby, powder of inorganic particles composed of $\{Li_{0.07}(Na_{0.5}K_{0.5})_{0.93}\}_{A/B}[Nb_{0.9}Ta_{0.1}]O_3$ (A/B=1.00) was obtained. The average particle diameter of the resulting powder was measured with a laser diffraction/scattering particle size distribution analyzer LA-750 manufactured by HORIBA, Ltd. using water as a dispersion medium. As a result, the median diameter (D50) was 0.2 µm.

(Shaping Step of Forming Self-Supported Sheet)

The powder of inorganic particles, polyvinyl butyral (BM-2, manufactured by Sekisui Chemical Co., Ltd.) as a binder, a plasticizer (DOP, manufactured by Kurogane Kasei Co., Ltd.), and a dispersant (SP-O30, manufactured by Kao Corporation) were mixed into a dispersion medium obtained by mixing equal amounts of toluene and isopropanol to prepare a shaping material in the form of a slurry. The amounts of the individual materials used were 250 parts by weight of the dispersion medium, 17.5 parts by weight of the binder, 7 parts by weight of the plasticizer, and 2 parts by weight of the dispersant on the basis of 100 parts by weight of inorganic particles. The resulting slurry was defoamed by stirring under reduced pressure so that the viscosity was adjusted to 500 to 700 cP. The viscosity of the slurry was measured using an LVT viscometer manufactured by Brookfield. The resulting slurry was formed into a sheet on a PET film by a doctor-blade method. The thickness after drying was set at 2 µm.

(Degreasing/Firing Step of Degreasing/Firing Self-Supported Sheet)

The sheet-like shaped body peeled off from the PET film was cut into a 50 mm square with a cutter and placed in the center of a setter made of zirconia (size: 70 mm square, height: 1 mm). Degreasing was performed at a temperature-rising rate of 10° C./min, at a calcining temperature of 600° C., with a retention time of one minute. Firing was performed, using an infrared lamp heating system manufactured by Ulvac-Riko, Inc., in a volatilization-promoting state in which the volatilization of the volatile component (e.g., Li, Na, K, or the like), the volatilization of which proceeds at a predetermined temperature or higher, contained in the shaped body is promoted. The firing was performed in a temperature range of 600° C. or higher, at a temperature-rising rate of 4° C./min, at a maximum firing temperature of 1,050° C., with a retention time of one minute. After firing, a portion not adhering to the setter was retrieved and used as a ceramic sheet (refer to FIG. 1) of Experimental Example 1. The firing in the volatilization-promoting state was performed in a state in which spacers composed of zirconia (size: 5 mm square, height: 10 mm) were placed at four corners of the setter on which the sheet-like shaped body was placed, and a quadrangular plate made of zirconia (size: 70 mm square, height: 1 mm) was further placed thereon. Table 1 shows a summary of the production conditions as well as the degree of orientation measured by the Lotgering method, the density, etc., which will be described below, in Experimental Example 1. Table 1 also shows the data in Experimental Examples 2 to 25, which will be described below.

TABLE 1

| Sample*1 | A/B ratio before firing | Temperature-rising rate (° C./min) | Volatile State | Degree of Orientation (%) | Density (%) |
|---|---|---|---|---|---|
| Experimental Example 1 | 1.00 | 4 | Promoting | 5 | 76 |
| Experimental Example 2 | 1.00 | 4 | Suppressing | 35 | 84 |
| Experimental Example 3 | 1.00 | 40 | Promoting | 15 | 80 |
| Experimental Example 4 | 1.00 | 40 | Suppressing | 24 | 84 |
| Experimental Example 5 | 1.00 | 120 | Promoting | 17 | 82 |
| Experimental Example 6 | 1.00 | 120 | Suppressing | 26 | 83 |
| Experimental Example 7 | 1.00 | 900 | Promoting | 21 | 83 |
| Experimental Example 8 | 1.00 | 900 | Suppressing | 24 | 85 |
| Experimental Example 9 | 1.20 | 4 | Promoting | 26 | 81 |
| Experimental Example 10 | 1.20 | 4 | Suppressing | 87 | 78 |
| Experimental Example 11 | 1.20 | 40 | Promoting | 84 | 88 |
| Experimental Example 12 | 1.20 | 40 | Suppressing | 68 | 86 |
| Experimental Example 13 | 1.20 | 120 | Promoting | 86 | 92 |
| Experimental Example 14 | 1.20 | 120 | Suppressing | 49 | 88 |
| Experimental Example 15 | 1.20 | 900 | Promoting | 81 | 91 |
| Experimental Example 16 | 1.20 | 900 | Suppressing | 47 | 89 |
| Experimental Example 17 | 1.35 | 4 | Promoting | 37 | 83 |
| Experimental Example 18 | 1.35 | 4 | Suppressing | 79 | 80 |
| Experimental Example 19 | 1.35 | 40 | Promoting | 96 | 87 |
| Experimental Example 20 | 1.35 | 40 | Suppressing | 64 | 87 |
| Experimental Example 21 | 1.35 | 120 | Promoting | 96 | 90 |

TABLE 1-continued

| Sample*1 | A/B ratio before firing | Temperature-rising rate (° C./min) | Volatile State | Degree of Orientation (%) | Density (%) |
|---|---|---|---|---|---|
| Experimental Example 22 | 1.35 | 120 | Suppressing | 50 | 87 |
| Experimental Example 23 | 1.35 | 900 | Promoting | 94 | 92 |
| Experimental Example 24 | 1.35 | 900 | Suppressing | 45 | 88 |
| Experimental Example 25 | 1.35 | 120 | Promoting | 95 | 92 |
| Experimental Example 26 | 1.35 | 120 | Promoting | 94 | 90 |
| Experimental Example 27 | 1.35 | 120 | Promoting | 78 | 96 |
| Experimental Example 28 | 1.20 | 120 | Promoting | 89 | 91 |

*1 Basic composition: $\{Li_{0.07}(Na_{0.5}K_{0.5})_{0.93}\}[Nb_{0.9}Ta_{0.1}]O_3$
Sheet thickness of 2 μm
*2 A/B ratio of $ABO_3$
*3 Temperature-rising rate at 600° C. or higher
*4 Promoting: Firing is performed in a firing furnace that has an open system
Suppressing: Firing under coexistence of a material having the same composition
*5 Degree of orientation by the Lotgering method
*6 Area of crystal plane to the total area in a visual field
*7 Sheet thickness of 15 μm
*8 Composition: $(Bi_{0.5}Na_{0.35}K_{0.1}Ag_{0.05})_{1.20}TiO_3$ Experimental Examples 2 to 8

A ceramic sheet of Experimental Example 2 was formed as in Experimental Example 1 except that the shaped body was fired in a volatilization-suppressing state in which the volatilization of the volatile component was suppressed. The firing in the volatilization-suppressing state was performed in a state in which green shaped sheets (size: 5 mm×40 mm, thickness: 100 μm) composed of the same shaping raw materials as those for the sheet-like shaped body were placed on the setter, on which the sheet-like shaped body was placed, outside the four sides of the sheet-like shaped body so as to surround the sheet-like shaped body, and a quadrangular plate made of zirconia (size: 70 mm square, height: 5 mm) was further placed thereon. In such a manner, the space around the sheet-like shaped body was minimized, and the same shaping raw materials as those for the sheet-like shaped body were allowed to coexist so that the atmosphere around the sheet-like shaped body was filled with the vapor of the volatile component (alkaline component). Furthermore, a ceramic sheet of Experimental Example 3 was formed as in Experimental Example 1 except that, in the firing step, the shaped body was fired in a temperature range of 600° C. (degreasing temperature) or higher, at a temperature-rising rate of 40° C./min. Furthermore, a ceramic sheet of Experimental Example 4 was formed as in Experimental Example 3 except that, in the firing step, the shaped body was fired in a volatilization-suppressing state in which the volatilization of the volatile component was suppressed. Furthermore, a ceramic sheet of Experimental Example 5 was formed as in Experimental Example 1 except that, in the firing step, the shaped body was fired at a temperature-rising rate of 120° C./min. Furthermore, a ceramic sheet of Experimental Example 6 was formed as in Experimental Example 5 except that, in the firing step, the shaped body was fired in a volatilization-suppressing state in which the volatilization of the volatile component was suppressed. Furthermore, a ceramic sheet of Experimental Example 7 was formed as in Experimental Example 1 except that, in the firing step, the shaped body was fired in a temperature range of 600° C. (degreasing temperature) or higher, at a temperature-rising rate of 900° C./min. Furthermore, a ceramic sheet of Experimental Example 8 was formed as in Experimental Example 7 except that, in the firing step, the shaped body was fired in a volatilization-suppressing state in which the volatilization of the volatile component was suppressed.

Experimental Examples 9 to 16

A ceramic sheet of Experimental Example 9 was formed as in Experimental Example 1 except that, in the raw material synthesis step, the raw materials were mixed such that the A/B ratio was 1.20. Furthermore, a ceramic sheet of Experimental Example 10 was formed as in Experimental Example 9 except that, in the firing step, the shaped body was fired in a volatilization-suppressing state in which the volatilization of the volatile component was suppressed. Furthermore, a ceramic sheet of Experimental Example 11 was formed as in Experimental Example 9 except that, in the firing step, the shaped body was fired in a temperature range of 600° C. (degreasing temperature) or higher, at a temperature-rising rate of 40° C./min. Furthermore, a ceramic sheet of Experimental Example 12 was formed as in Experimental Example 11 except that, in the firing step, the shaped body was fired in a volatilization-suppressing state in which the volatilization of the volatile component was suppressed. Furthermore, a ceramic sheet of Experimental Example 13 was formed as in Experimental Example 9 except that, in the firing step, the shaped body was fired in a temperature range of 600° C. (degreasing temperature) or higher, at a temperature-rising rate of 120° C./min. Furthermore, a ceramic sheet of Experimental Example 14 was formed as in Experimental Example 13 except that, in the firing step, the shaped body was fired in a volatilization-suppressing state in which the volatilization of the volatile component was suppressed. Furthermore, a ceramic sheet of Experimental Example 15 was formed as in Experimental Example 9 except that, in the firing step, the shaped body was fired in a temperature range of 600° C. (degreasing temperature) or higher, at a temperature-rising rate of 900° C./min. Furthermore, a ceramic sheet of Experimental Example 16 was formed as in Experimental Example 15 except that, in the firing step, the shaped body was fired in a volatilization-suppressing state in which the volatilization of the volatile component was suppressed.

Experimental Examples 17 to 24

A ceramic sheet of Experimental Example 17 was formed as in Experimental Example 1 except that, in the raw material synthesis step, the raw materials were mixed such that the A/B ratio was 1.35. Furthermore, a ceramic sheet of Experimental Example 18 was formed as in Experimental Example 17 except that, in the firing step, the shaped body was fired in a volatilization-suppressing state in which the volatilization of the volatile component was suppressed. Furthermore, a ceramic sheet of Experimental Example 19 was formed as in Experimental Example 17 except that, in the firing step, the shaped body was fired in a temperature range of 600° C. (degreasing temperature) or higher, at a temperature-rising rate of 40° C./min. Furthermore, a ceramic sheet of Experimental Example 20 was formed as in Experimental Example 19 except that, in the firing step, the shaped body was fired in a volatilization-suppressing state in which the volatilization of the volatile component was suppressed. Furthermore, a ceramic sheet of Experimental Example 21 was formed as in Experimental Example 17 except that, in the firing step, the shaped body was fired in a temperature range of 600° C. (degreasing temperature) or higher, at a temperature-rising rate of 120° C./min. Furthermore, a ceramic sheet of Experimental Example 22 was formed as in Experimental Example 21 except that, in the firing step, the shaped body was fired in a volatilization-suppressing state in which the volatilization of the volatile component was suppressed. Furthermore, a ceramic sheet of Experimental Example 23 was formed as in Experimental Example 17 except that, in the firing step, the shaped body was fired in a temperature range of 600° C. (degreasing temperature) or higher, at a temperature-rising rate of 900° C./min. Furthermore, a ceramic sheet of Experimental Example 24 was formed as in Experimental Example 23 except that, in the firing step, the shaped body was fired in a volatilization-suppressing state in which the volatilization of the volatile component was suppressed.

Experimental Examples 25 and 26

A ceramic sheet of Experimental Example 25 was formed as in Experimental Example 21 except that, in the firing step, the sheet-like shaped body peeled off from the PET film was cut into a 50 mm square with a cutter and placed in the center of a mesh setter made of Pt (size: 70 mm square, wire diameter: 0.1 mm, 80-mesh) when firing was performed. Furthermore, a ceramic sheet of Experimental Example 26 was formed as in Experimental Example 25 except that the shaped body was fired while being placed in the center of a setter made of zirconia (size: 70 mm square, thickness 1 mm), the surface of which was roughened. In the setter used, the surface roughness Ra was 5 µm, the Ra value being the average of the absolute values of the peak heights from the mean line, the Rmax value was 30 the Rmax value being the sum of the height of the highest peak from the mean line and the depth of the lowest valley from the mean line, and the surface roughness Rz was 25 the Rz value being calculated on the basis of the average of the heights of the top ten highest peaks from the mean line and the average of the depths of the top ten lowest valleys from the mean line (refer to JIB-B0601:2001).

Experimental Example 27

A ceramic sheet of Experimental Example 27 was formed as in Experimental Example 21 except that, in the shaping step of forming the self-supported sheet, the thickness after drying was set at 15 µm.

Experimental Example 28

Powders ($Bi_2O_3$, $Na_2CO_3$, $K_2CO_3$, $Ag_2O$, and $TiO_2$) were weighed so as to satisfy the composition $(Bi_{0.5}Na_{0.35}K_{0.1}Ag_{0.05})_{A/B}TiO_3$ (A/B=1.20). Wet mixing, pulverization, and drying were performed as in Experimental Example 13, and then calcination was performed at 900° C. for 2 hours. The calcined powder was pulverized and dried as in Experimental Example 13. Thereby, powder of inorganic particles composed of $(Bi_{0.5}Na_{0.35}K_{0.1}Ag_{0.05})_{1.20}TiO_3$ was obtained. This powder was formed into a sheet as in Experimental Example 13 such that the thickness after drying was 2 µm. The sheet-like shaped body was degreased at a temperature-rising rate of 10° C./min, at a calcining temperature of 600° C., with a retention time of one minute. Firing was performed as in Experimental Example 13 except that the maximum firing temperature was set at 1,250° C. Thus, a ceramic sheet of Experimental Example 28 was obtained.

(Electron Microscopy and Calculation of Density)

With respect to the ceramic sheets of Experimental Examples 1 to 28, SEM photographs were taken using a scanning electron microscope (JSM-6390 manufactured by JEOL Ltd.). The density (%) of each of the ceramic sheets was determined from the SEM photographs. The sheet surface of the ceramic sheet was observed, and in a field of view which included about 100 to 200 crystal grains, calculation was made according to the formula {(area of grains)/(total area)}. The resulting value was considered as the density (%) of the ceramic sheet in the field of view. This process was carried out in any three fields of view, and the average of the densities of the ceramic sheet in the individual fields of view was obtained. The resulting value was considered as the density of the ceramic sheet. FIG. 3 shows SEM photographs in Experimental Examples 10, 15, and 23.

(Calculation of Degree of Orientation)

Figure 4:
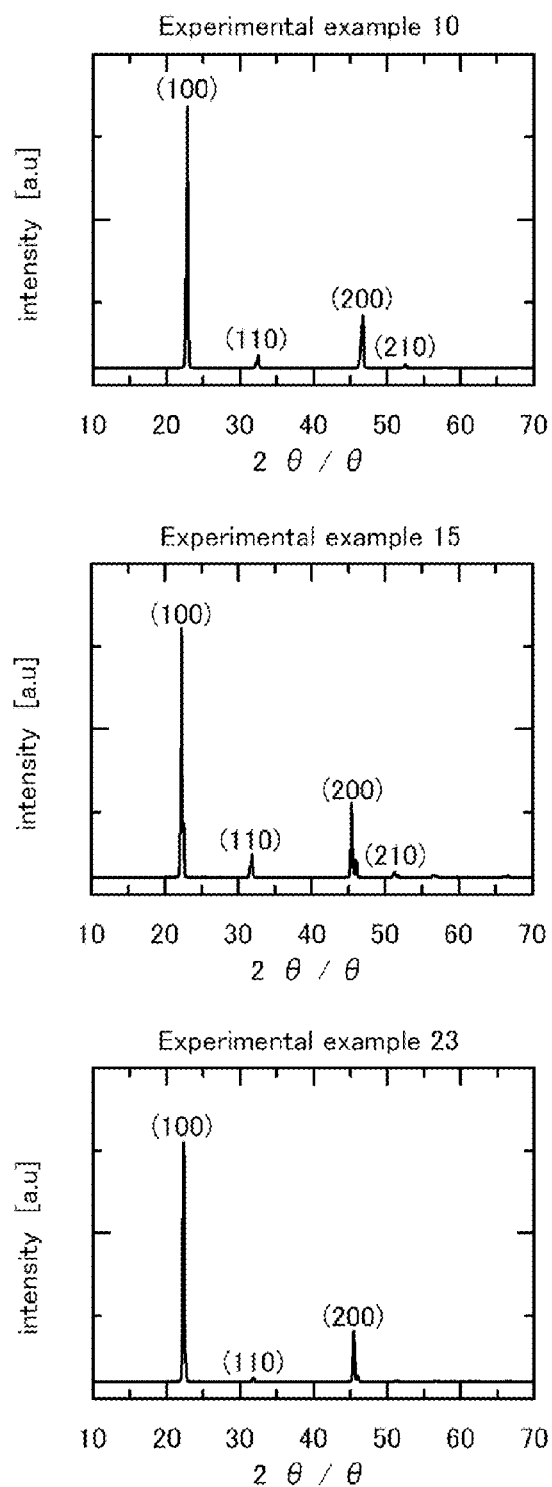
FIG. 4 shows X-ray diffraction patterns in Experimental Examples 10, 15, and 23.

With respect to each of the ceramic sheets of Experimental Examples 1 to 28, an XRD diffraction pattern was measured when the surface of the sheet was irradiated with X-ray using an XRD diffraction device (RAD-IB manufactured by Rigaku Corporation). The degree of orientation of the pseudocubic (100) plane was measured by the Lotgering method in which the degree of orientation was calculated according to the equation (2) described above using peaks of pseudocubic (100), (110), and (111) planes. FIG. 4 shows X-ray diffraction patterns in Experimental Examples 10, 15, and 23.

(Thermogravimetric (TG) Measurement)

The volatile component contained in $ABO_3$, i.e., a main component of the ceramic sheet, was examined. Concerning alkali niobates, powders of $\{Li_{0.07}(Na_{0.5}K_{0.5})_{0.93}\}_{A/B}$ $[Nb_{0.9}Ta_{0.1}]O_3$ $_{(A/B=}$1.00, 1.20, and 1.35) were measured. Thermogravimetric measurement was performed, using a Thermo plus TG8120 manufactured by Rigaku Corporation, with a sample weight of 0.03 g, at a temperature-rising rate of 3° C./min, up to 1,100° C. for alkali niobates and up to 1,400° C. for $Pb(Zr, Ti)O_3$.

[Evaluation Results]

Figure 5:
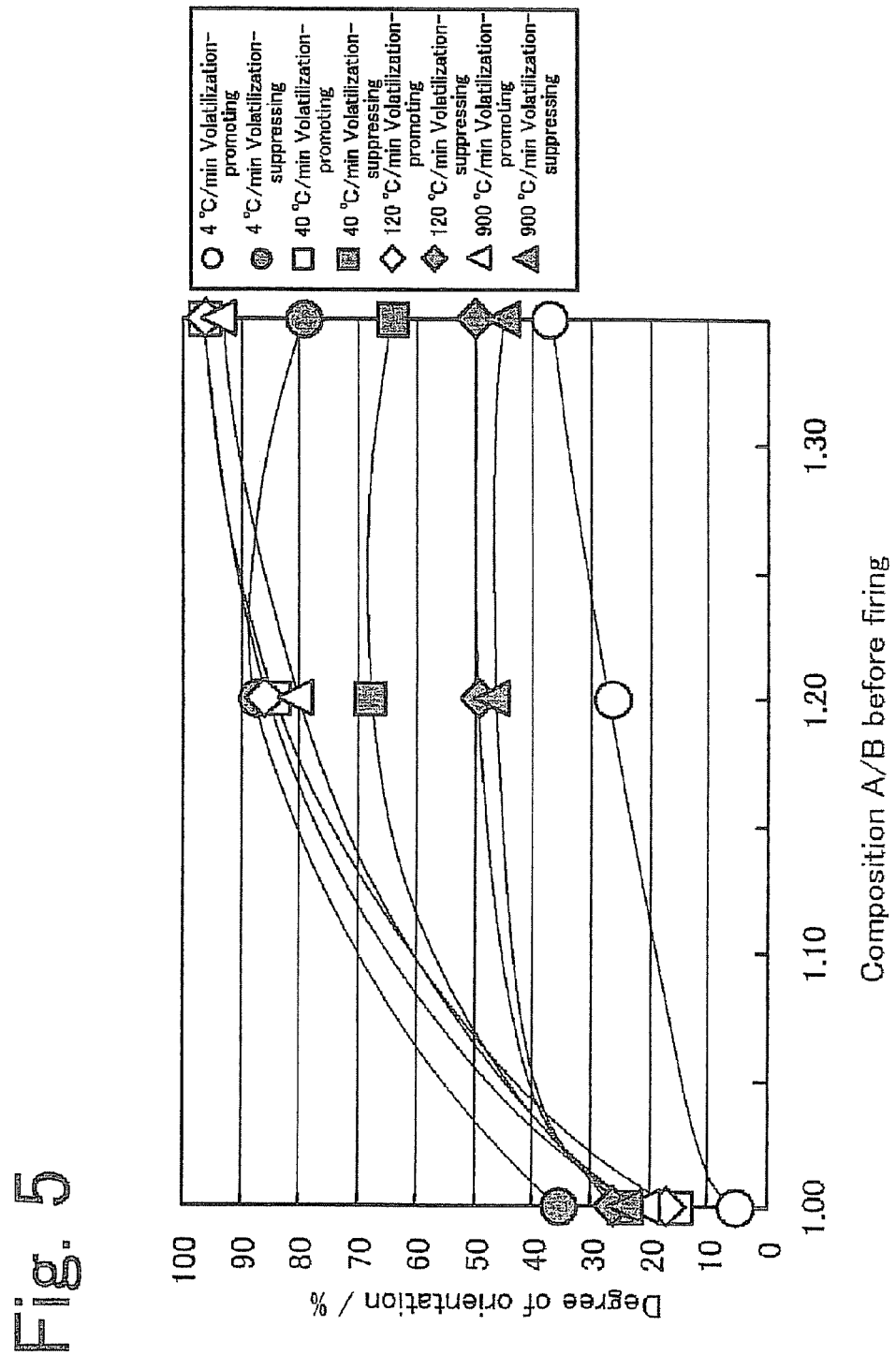
FIG. 5 is a graph showing the relationship between the degree of orientation and the A/B ratio before firing.
Figure 6:
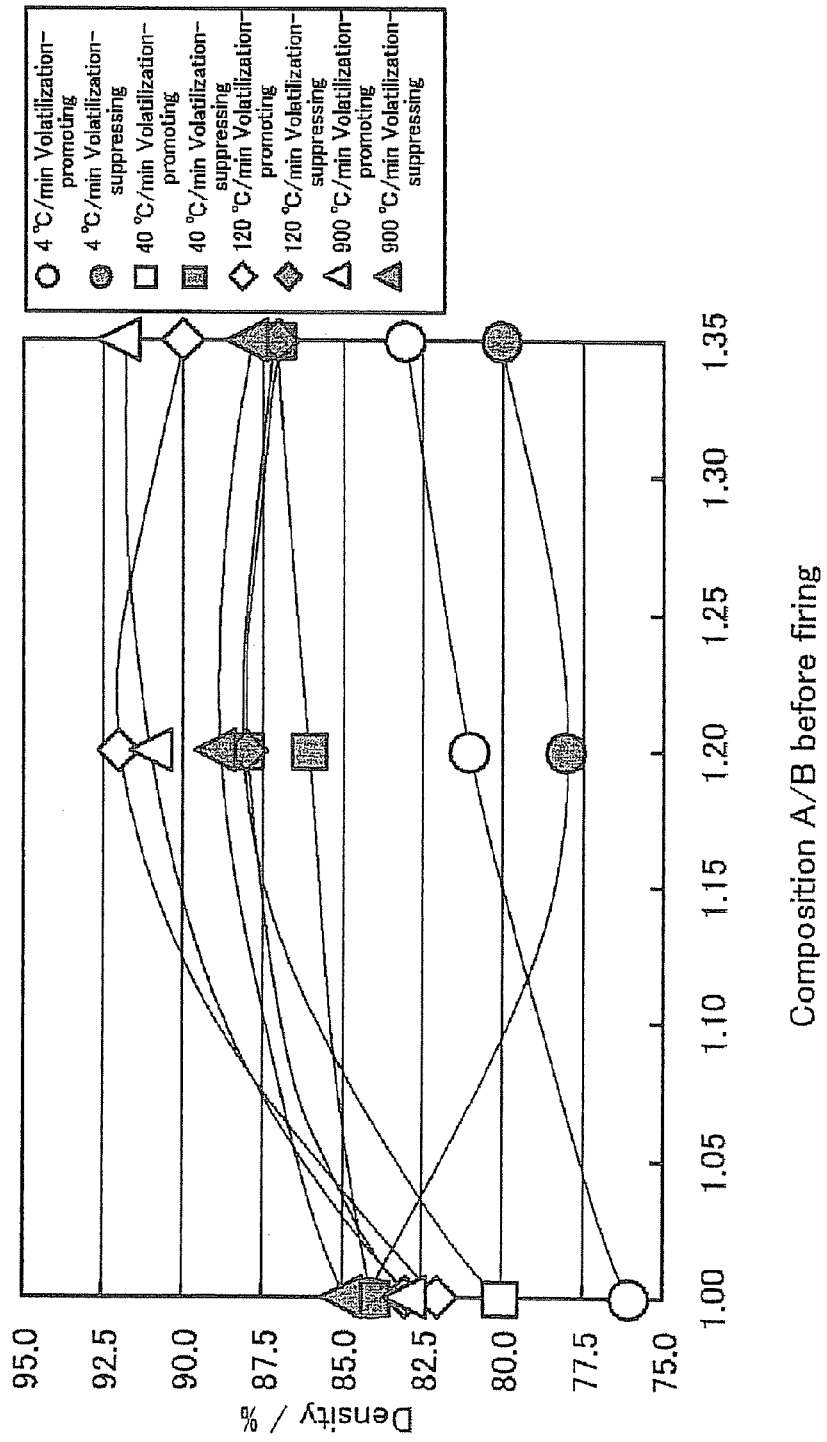
FIG. 6 is a graph showing the relationship between the density and the A/B ratio before firing.
Figure 7:
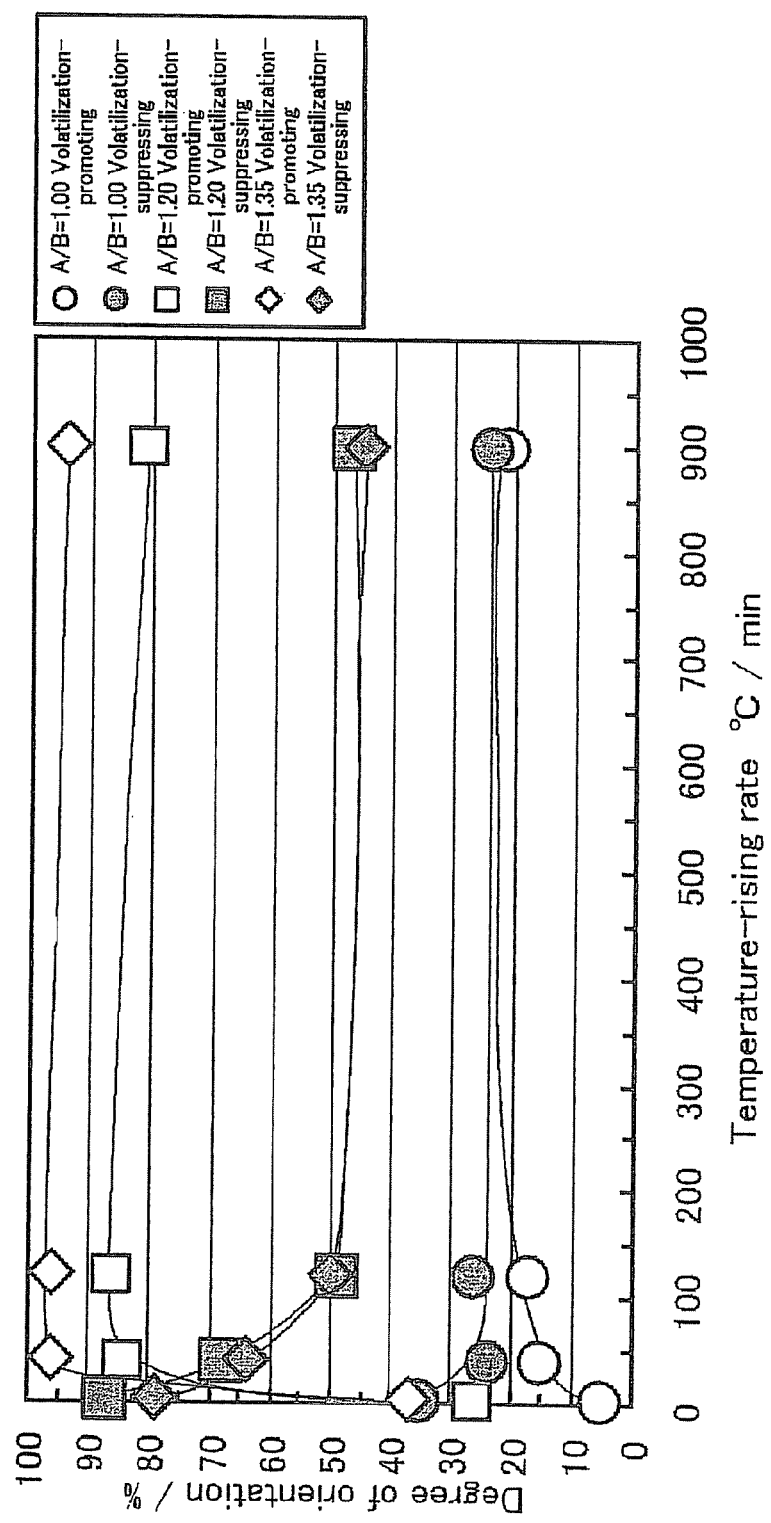
FIG. 7 is a graph showing the relationship between the degree of orientation and the temperature-rising rate.

The evaluation results of Experimental Examples 1 to 28 are shown in Table 1 and FIGS. 5 to 8. Table 1 shows the A/B ratio before firing (at the time of mixing the raw materials), the temperature-rising rate (° C./min) at 600° C. (degreasing temperature) or higher, the volatilization state, the degree of orientation (%) measured by the Lotgering method, and the density (%). FIG. 5 is a graph showing the relationship between the degree of orientation and the A/B ratio before firing. FIG. 6 is a graph showing the relationship between the density and the A/B ratio before firing. FIG. 7 is a graph showing the relationship between the degree of orientation and the temperature-rising rate. FIG. 8 is a graph showing the relationship between the density and the temperature-rising rate. According to the results of the experimental examples, as is evident from FIGS. 5 to 8, the ceramic sheets of the present invention have a degree of orientation of 40% or more and a density of 85% or more at an A/B ratio in a range of 1.05 or more and at a temperature-rising rate in a range of 30° C./min or more, which is preferable. This tendency is presumed to continue until the A/B ratio reaches 1.50. With respect to the volatilization-promoting state and the volatilization-suppressing state, as is evident from the evaluation results, at a temperature-rising rate of 30° C./min or more, the degree of orientation in the volatilization-promoting state is more enhanced than that in the volatilization-suppressing state, which confirms that the volatilization-promoting state is preferable. Furthermore, at an A/B ratio of 1.20 to 1.35, when firing is performed in the volatilization-promoting state, the degree of orientation is 75% or more and the density is 90% or more, which is very preferable. As is evident from the evaluation results, when the A/B ratio is set at 1.05 or more, it is possible to produce a suitable ceramic sheet having a higher degree of orientation and a higher density under the condition of a very short period of firing time, i.e., at a temperature-rising rate of 30° C./min. As is also evident from the evaluation results, even when a setter in which the contact area with the shaped sheet is decreased, such as a setter, the surface of which is roughened, or a Pt mesh setter, is used as the setter on which the shaped body is placed in the firing step, under the same conditions of the A/B ratio before firing (at the time of mixing the raw materials), the temperature-rising rate (° C./min) at 600° C. (degreasing temperature) or higher, and the volatilization state, it is possible to obtain the degree of orientation and density equivalent to those in the case where a planar setter is used. Furthermore, as is evident from the results of Experimental Example 27, the same advantages are obtained even if the thickness of the sheet is set at 15 μm. Furthermore, as is evident from the results of Experimental Example 28, the same advantages are obtained even in the case where the basic composition is a BNKT-based composition.

This specification incorporates by reference the entire contents of the specifications, drawings, and claims disclosed in Japanese Patent Application No. 2008-287691 filed in the Japanese Patent Office on Nov. 10, 2008 and Japanese Patent Application No. 2009-156928 filed in the Japanese Patent Office on Jul. 1, 2009.

What is claimed is:

1. A method for producing a single layer crystallographically-oriented ceramic sheet, which is self-supported and planar, including a raw material synthesis step of synthesizing inorganic particles by mixing raw materials to form an oxide represented by general formula $ABO_3$ such that the ratio of the A site to the B site, the A/B ratio, is 1.05 or more, a shaping step of forming the synthesized inorganic particles into a self-supported planar shaped body with a sheet thickness of 30 μm or less, and a firing step of firing the shaped body, without an inactive layer or on a setter which does not substantially react with the shaped body, at a temperature-rising rate of 30° C./min or more at least in a temperature range which is equal to or higher than a predetermined temperature.

2. The method for producing the single layer crystallographically-oriented ceramic sheet according to claim 1, wherein, in the raw material synthesis step, the raw materials containing a volatile component, the volatilization of which is promoted at the predetermined temperature or higher, are mixed, and
wherein, in the firing step, the shaped body is fired in a volatilization-promoting state in which the volatilization of the volatile component is promoted.

3. The method for producing the single layer crystallographically-oriented ceramic sheet according to claim 1, wherein, in the firing step, the shaped body is fired at a temperature-rising rate of 40° C./min to 900° C./min in the temperature range which is equal to or higher than the predetermined temperature.

4. The method for producing the single layer crystallographically-oriented ceramic sheet according to claim 1, wherein, in the firing step, firing is performed such that, after the temperature is raised at the temperature-rising rate, the shaped body is retained at a predetermined maximum firing temperature for 30 minutes or less.

5. The method for producing the single layer crystallographically-oriented ceramic sheet according to claim 1, wherein, in the firing step, the planar shaped body is fired while being placed on an inactive layer having at least one of a region which is in point contact with the shaped body and a region which is in line contact with the shaped body.

6. The method for producing the single layer crystallographically-oriented ceramic sheet according to claim 1, wherein, in the raw material synthesis step, the raw materials are mixed such that the A/B ratio is 1.2 to 1.35.

7. The method for producing the single layer crystallographically-oriented ceramic sheet according to claim 1, wherein, in the raw material synthesis step, the raw materials are mixed such that the inorganic particles form crystal grains including an oxide represented by general formula $ABO_3$ as a main component, wherein the A site contains at least one element selected from the group consisting of Li, Na, K, Bi, and Ag, and the B site contains at least one element selected from the group consisting of Nb, Ta, and Ti.

8. The method for producing the single layer crystallographically-oriented ceramic sheet according to claim 1, wherein, in the raw material synthesis step, the raw materials are mixed such that the inorganic particles form crystal grains having an oxide represented by general formula $ABO_3$ as a main component, wherein the A site contains Pb, and the B site contains at least one element selected from the group consisting of Mg, Zn, Nb, Ni, Ti, and Zr.

9. The method for producing the single layer crystallographically-oriented ceramic sheet according to claim 1, wherein, in the shaping step, the synthesized inorganic particles are formed into a self-supported planar shaped body with a sheet thickness of 10 μm or less.

10. The method for producing the single layer crystallographically-oriented ceramic sheet according to claim 1, wherein the ceramic sheet produced has a degree of orientation of 40% or more as measured by the Lotgering method.

11. The method for producing the single layer crystallographically-oriented ceramic sheet according to claim 1, wherein the A/B ratio is 1.2 or more.

12. The method for producing the single layer crystallographically-oriented ceramic sheet according to claim 1, further comprising, after the firing step, a crushing step of crushing the fired ceramic sheet and forming a shaped body with a secondary orientation by using crystal grains of the crushed ceramic sheet.

* * * * *

UNITED STATES PATENT AND TRADEMARK OFFICE
CERTIFICATE OF CORRECTION

| | | |
|---|---|---|
| PATENT NO. | : 8,597,567 B2 | Page 1 of 1 |
| APPLICATION NO. | : 12/612034 | |
| DATED | : December 3, 2013 | |
| INVENTOR(S) | : Shohei Yokoyama, Nobuyuki Kobayashi and Tsutomu Nanataki | |

It is certified that error appears in the above-identified patent and that said Letters Patent is hereby corrected as shown below:

Title page, Item (56), References Cited

FOREIGN PATENT DOCUMENTS, page 2 (second Column)

Change: "JP 1 972 604 A1 9/2008" to -- EP 1 972 604 A1 9/2008 --

"JP 1 975 137 A1 10/2008" to -- EP 1 975 137 A1 10/2008 --

Signed and Sealed this
Twenty-fifth Day of February, 2014

Michelle K. Lee
*Deputy Director of the United States Patent and Trademark Office*